(12) United States Patent
Dawson et al.

(10) Patent No.: US 9,285,422 B2
(45) Date of Patent: Mar. 15, 2016

(54) TESTER AND METHOD FOR TESTING A STRIP OF DEVICES

(75) Inventors: Chad S. Dawson, Queen Creek, AZ (US); Stephen R. Hooper, Mesa, AZ (US); Peter T. Jones, Scottsdale, AZ (US); Mark E. Schlarmann, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 952 days.

(21) Appl. No.: 13/465,651

(22) Filed: May 7, 2012

(65) Prior Publication Data

US 2013/0297248 A1 Nov. 7, 2013

(51) Int. Cl.
*G01R 31/317* (2006.01)
*B81C 99/00* (2010.01)
*G01R 31/06* (2006.01)
*G01R 31/28* (2006.01)

(52) U.S. Cl.
CPC ........ *G01R 31/31718* (2013.01); *B81C 99/005* (2013.01); *B81C 99/0045* (2013.01); *B81B 2207/03* (2013.01); *G01R 31/06* (2013.01); *G01R 31/2829* (2013.01); *G01R 31/2844* (2013.01)

(58) Field of Classification Search
CPC ............. G01R 31/31718; G01R 31/06; G01R 31/2844; G01R 31/2829; G01R 31/317; G01R 31/28; B81C 99/0045; B81C 99/005; B81C 99/0035; B81C 99/004; B81B 2207/03; G01L 27/005; G01L 27/002; G01L 27/007; G01L 25/00

See application file for complete search history.

(56) References Cited

U.S. PATENT DOCUMENTS

| | | | | |
|---|---|---|---|---|
| 4,956,602 | A | * | 9/1990 | Parrish ............... G01R 31/2831 257/E21.526 |
| 5,617,431 | A | * | 4/1997 | Tupuri ........... G01R 31/318307 714/738 |
| 6,629,448 | B1 | * | 10/2003 | Cvancara ....................... 73/1.38 |
| 7,043,960 | B1 | | 5/2006 | Lueck |
| 7,852,109 | B1 | * | 12/2010 | Chan ................ G01R 31/31724 326/16 |
| 7,892,876 | B2 | | 2/2011 | Mehregany |
| 2007/0023851 | A1 | * | 2/2007 | Hartzell ............. B81C 1/00246 257/414 |
| 2007/0095146 | A1 | | 5/2007 | Brosh |
| 2008/0081958 | A1 | * | 4/2008 | Denison ............... A61N 1/3706 600/300 |

\* cited by examiner

*Primary Examiner* — Manuel L Barbee
(74) *Attorney, Agent, or Firm* — Ingrassia Fisher & Lorenz, P.C.

(57) ABSTRACT

A tester configured to test a strip of devices is provided. The tester may include a communications system, a plurality of communication lines, a plurality of multiplexors, each multiplexor having at least two outputs, wherein each multiplexor is configured to receive a signal generated by the communications system via one of the plurality of communication lines, and each multiplexor may be selectably coupled to at least two of the devices in the strip of devices. The tester may be configured to index the plurality of communication lines to a first subset of the devices, initiate at least one test, command the devices to generate data for each of the at least one tests, retrieve data from a first set of the devices, and retrieve data from a second set of the devices.

20 Claims, 8 Drawing Sheets

TESTER AND METHOD FOR TESTING A STRIP OF DEVICES

TECHNICAL FIELD

The following relates to testers and devices.

BACKGROUND

For improved efficiency during production, devices, such as integrated circuits, are often assembled in groups on a single carrier commonly referred to as a 'strip.' After assembly, the individual devices on the strip need to be tested and/or calibrated. Test time for a strip of devices is limited by the number of tester resources available, such as input and output communication lines. Generally, there are far more devices on a strip of devices than there are tester resources. Accordingly, each test or calibration procedure may have to be repeated for each subset of devices coupled to the tester.

DESCRIPTION OF THE DRAWING FIGURES

Exemplary embodiments will hereinafter be described in conjunction with the following drawing figures, wherein like numerals denote like elements. It should be noted that the figures are not necessarily drawn to scale.

DETAILED DESCRIPTION

According to various exemplary embodiments, a tester, a strip of devices and a method of testing the strip of devices are provided. The tester includes multiplexors which can be selectively coupled to multiple devices. Accordingly, the number of devices which can be tested in any given test may be increased based upon the number of devices coupled to each multiplexor. In one embodiment, certain inputs for each device on the strip may be coupled such that a test may only need to be performed once for an entire strip of devices, as discussed in further detail below.

Figure 1:
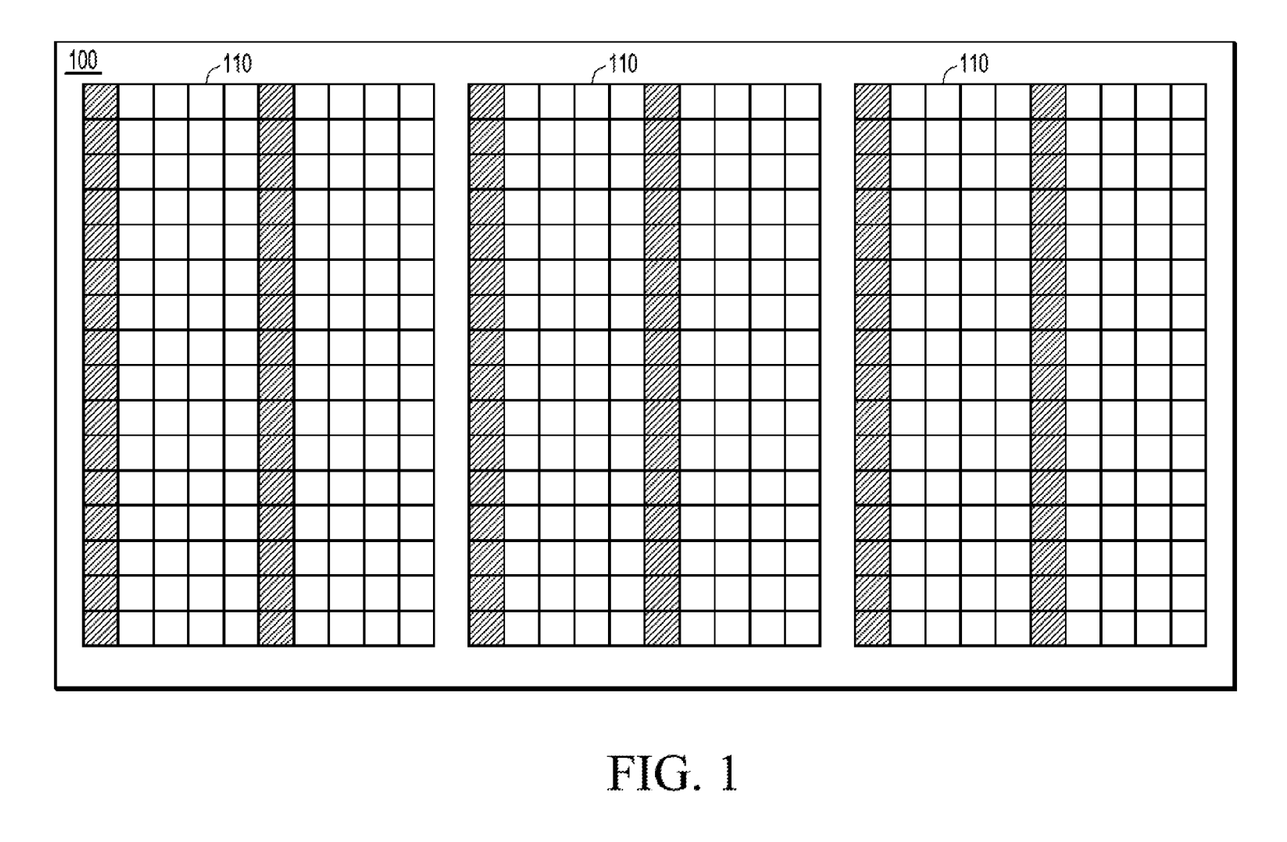
FIG. 1 illustrates a strip of devices, in accordance with an embodiment.

FIG. 1 illustrates a strip 100 of devices 110, in accordance with an embodiment. In one embodiment, for example, the devices 110 may be micro-electrical-mechanical systems (MEMS), such as accelerometers or gyroscopes. In other embodiments, the devices 110 could be application-specific integrated circuits (ASICs), processors or any other type of integrated circuit or logic device. In the embodiment illustrated in FIG. 1, there are 480 devices 110 distributed in thirty columns and sixteen rows, however, the number of devices 110 and their orientation on the strip 100 may vary.

Each device 110 on the strip 100 may have to be tested for any manufacturing defects and may have to be calibrated to account for variances in the manufacturing process. Testers are limited by the number of available resources, for example, input/output (I/O) lines. A tester, for example, may only have enough I/O lines to simultaneously test a small subset of the devices 110 on a strip 100. Accordingly, testers generally have to test devices 110 in a multiplexed fashion, testing a subset of the devices 110 and repeating the test procedure until all of the subsets of devices 110 are tested. Some MEMS testing procedures require time consuming mechanical stimuli which, when repeated for each subset of devices 110, can take a majority of the total test time for each strip 100. Accordingly, as discussed in further detail below, the amount of total test time for each strip can be reduced by increasing the number of devices that are tested at the same time.

Figure 2:
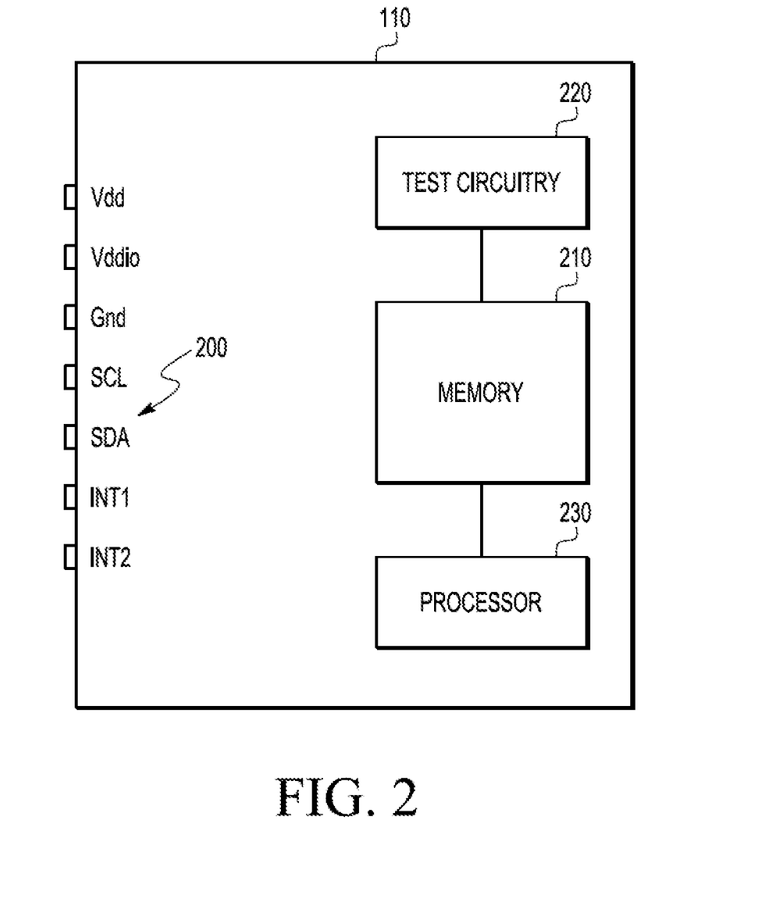
FIG. 2 is a block diagram on an exemplary device, in accordance with an embodiment.

FIG. 2 is a block diagram on an exemplary device 110, in accordance with an embodiment. The device 110 includes multiple I/Os 200. The I/O lines may be used to provide power and ground to the device, and lines to send and receive data between the device 110 and the tester. The device 110 may further include one or more interrupt lines to trigger one or more tests, as discussed in further detail below. The device further includes a memory 210. The memory 210 could include a series of registers or any other memory element capable of storing samples of data. In one embodiment, for example, the memory 210 may be a first-in-first-out (FIFO) queue. The size of the memory 210 may vary depending upon the amount of data that the device 110 needs to store during the testing process. The memory 210 may be coupled to test circuitry 220. The test circuitry 220 generates the data that may be used to test and/or calibrate the device 110. The test circuitry 220 will vary depending upon what type of devices is being tested. In one embodiment, for example, the devices 110 may also include a processor 230. The processor 230 may be coupled to the memory 210 and may be configured to analyze the generated data. In one embodiment, for example, the processor 230 may calibrate the device 110 based upon the data generated by the test circuitry 220 stored in the memory 210.

Figure 3:
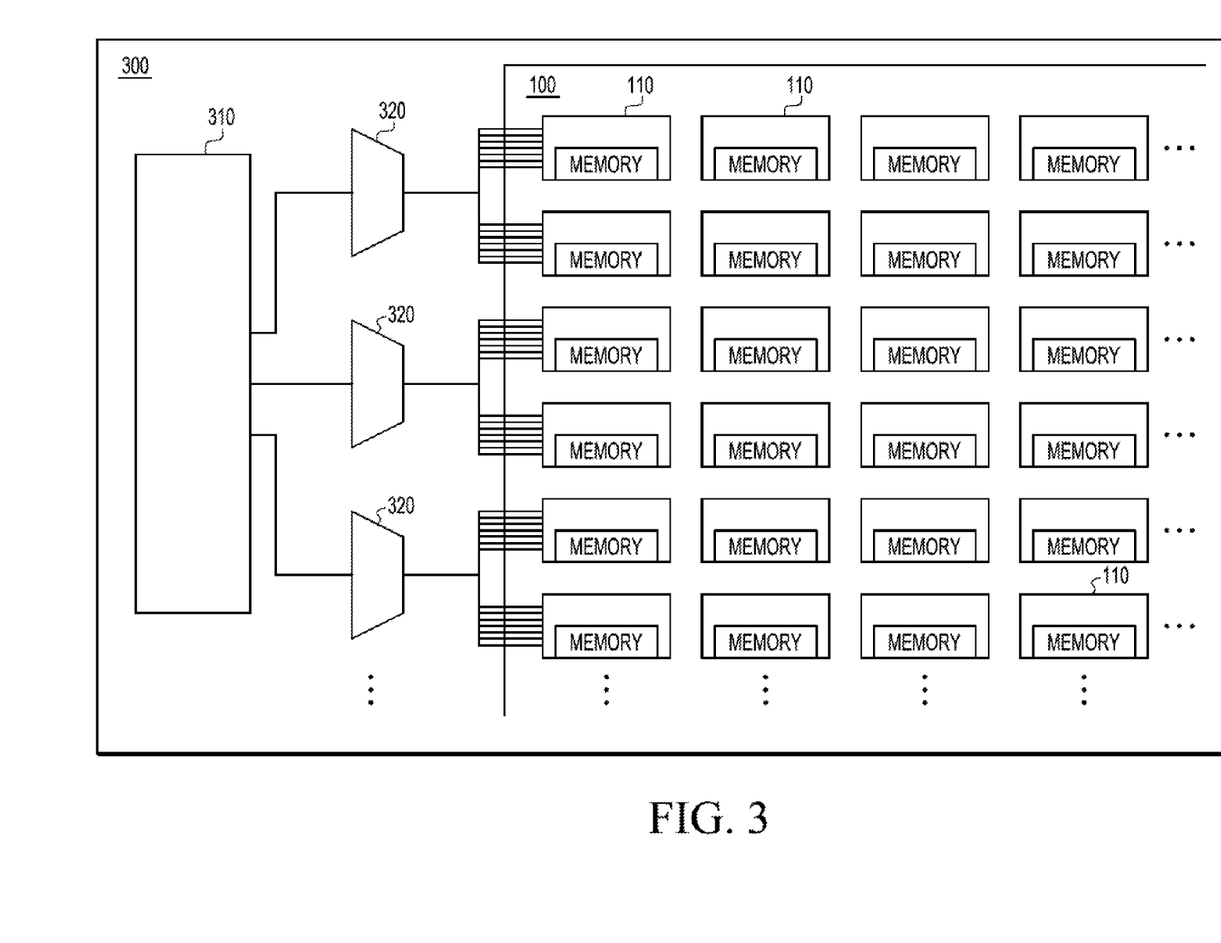
FIG. 3 illustrates a tester and a strip of devices in accordance with an embodiment.

FIG. 3 illustrates a tester 300 and a strip 100 of devices 110 in accordance with an embodiment. The tester 300 includes a communication system 310 for sending and receiving signals used to test the devices 110. The tester 300 further includes a series of multiplexors 320. In one embodiment, for example, the multiplexors 320 may include a series of single-pole single-throw relays. Each of the multiplexors 320 may selectively couple a communication line of the communications system 310 to at least two devices 110. The number of multiplexors 320 and communications lines may vary depending upon the number of I/Os of the device 110. In the embodiments illustrated in FIGS. 2 and 3, there are seven communication lines, and thus each multiplexor 320 would have fourteen outputs. As discussed above, the number of devices 110 in the strip may far outweigh the number of communication lines in the communications system 310. Accordingly, by coupling each multiplexor 320 to two devices 110, the number of devices tested in a given testing cycle is increased, as discussed in further detail below. The tester 300 may also include a handler (not illustrated). In one embodiment, for example, the handler may have stationary communication lines and a system for moving the strip to couple the devices to the communication lines. In another embodiment, for example, the handler may move the communication lines around a stationary strip 100.

Figure 4:
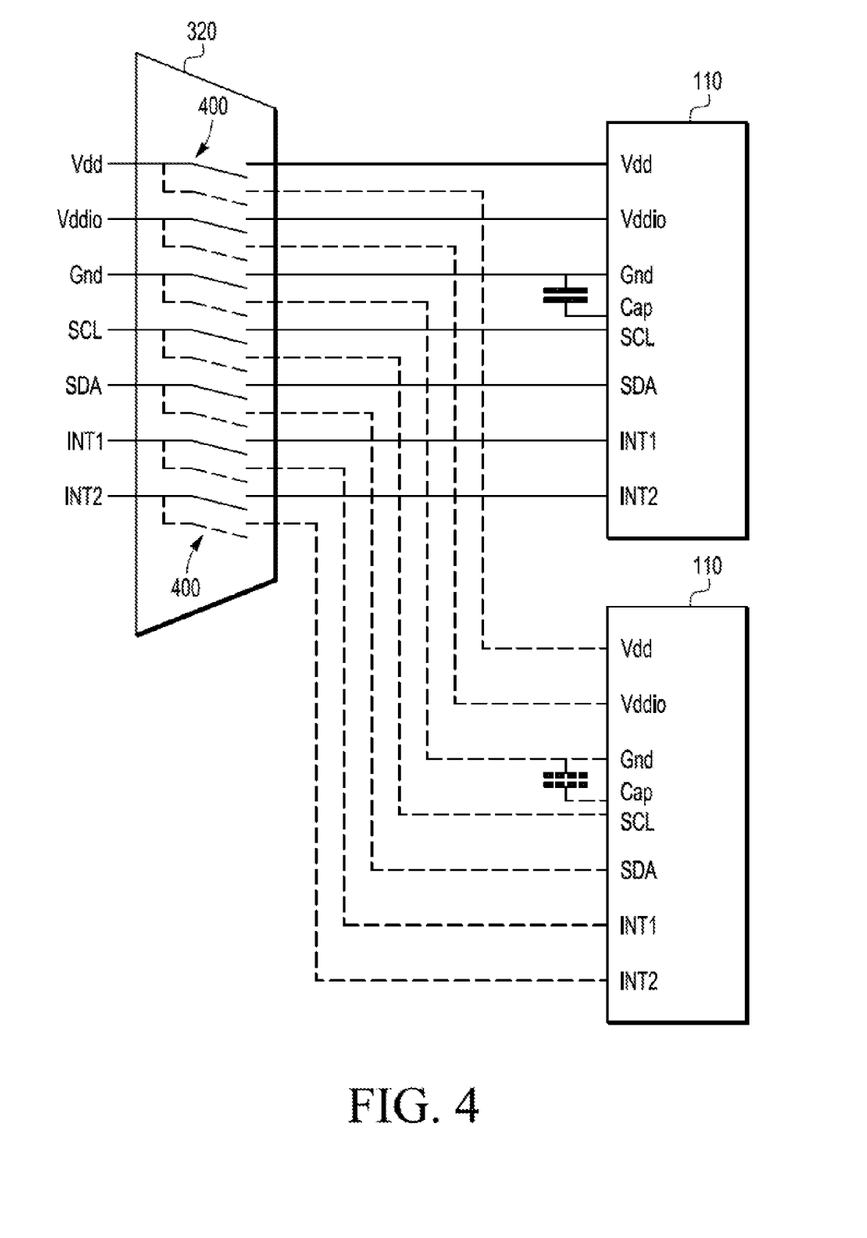
FIG. 4 illustrates how the I/O lines from a tester connect to multiple devices, in accordance with an embodiment.

FIG. 4 illustrates how the I/O lines from a tester connect to multiple devices, in accordance with an embodiment. As seen in FIG. 4, seven I/O lines are connected between the tester 300 and each device 110. Each multiplexor 320 is capable of selectively coupling any one of the two devices to a respective I/O line or connecting both devices 110 to the I/O line simultaneously. While FIGS. 3 and 4 illustrate a one-to-two multiplexor (i.e., a single input being selectively coupled to two outputs), in other embodiments, for example, the multiplexor may be coupled to any number of devices. For example, the multiplexor may be a one-to-three multiplexor, a one-to-four multiplexor, or more. In the embodiment illustrated in FIG. 4, the multiplexor 320 is formed using fourteen single-pole single throw relays 400. Each relay 400 may be controlled individually. Accordingly, the outputs of the multiplexor 320 controlling the power to the devices (e.g., the Vdd I/O line) may be coupled to both devices throughout a test, whereas data communication lines (e.g., the SDA I/O line) may be coupled to just one of the devices at a time, as discussed in further detail below.

Figure 5:
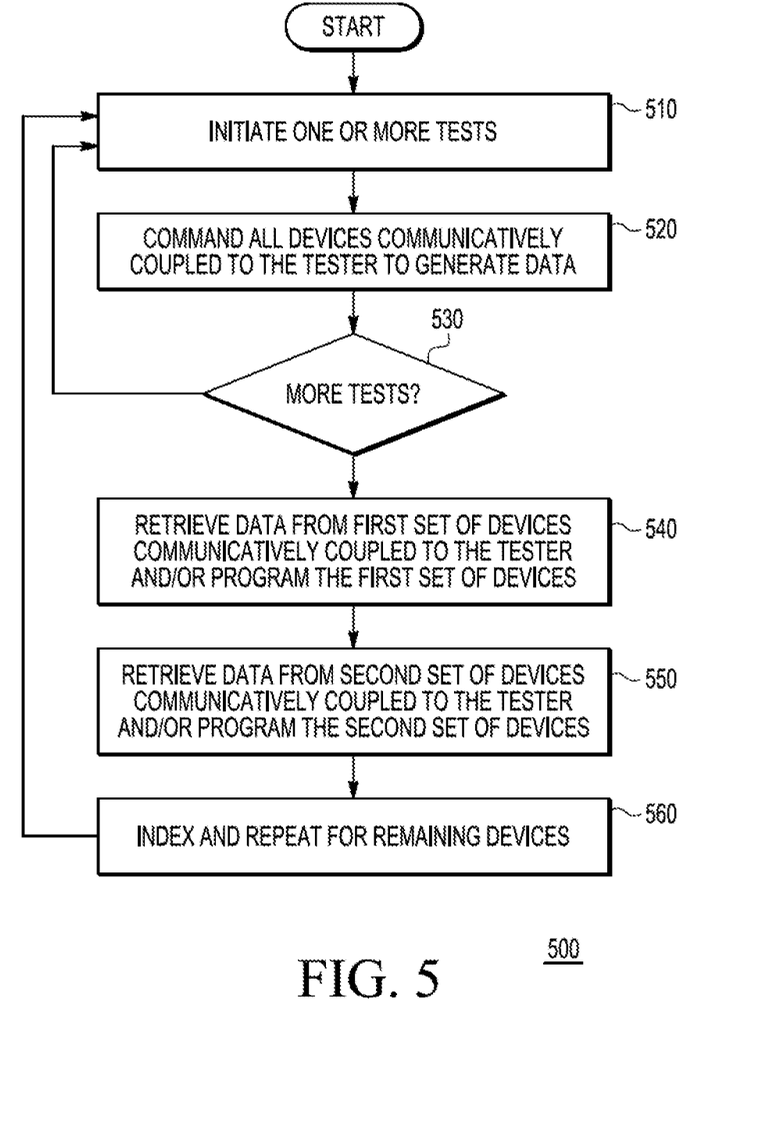
FIG. 5 is a flow chart illustrating an exemplary method for testing devices in accordance with an embodiment.

FIG. 5 is a flow chart illustrating an exemplary method 500 for testing devices in accordance with an embodiment. The method begins when the tester indexes to a first subset of devices and initiates a first test. (Step 510). As discussed above, the test(s) may vary depending upon the device. In one embodiment, for example, if the device is an accelerometer, a predetermined acceleration may be applied by the tester 300 to the strip 100. In other embodiments, for example, other mechanical or electrical stimuli may be applied to the devices. The tester 300 then commands all of the devices 110 coupled to the tester 300 to generate data. (Step 520). In one embodiment, for example, the tester 300 may command the devices 110 to generate data by sending a signal to an interrupt line, such as INT1, on the devices 110. Since each device 110 includes a memory 210, each device 110 stores the generated data for later retrieval. In one embodiment, for example, the memory 210 may be a volatile memory. Accordingly, each device would need to receive power from the tester 300 in order to maintain the data stored in the memory. As discussed above, the strip 100 may include more devices 110 than the tester 300 has resources for. Accordingly, only a subset of the devices 110 on the strip may be able to be connected to a power source and be instructed to generate data based upon the number of tester resources available. However, because the tester employs the multiplexors 320 illustrated in FIGS. 3-4, and each multiplexor 320 is connected to two devices 110, the number of times each test has to be run is reduced by half.

The tester then determines if there are any more tests to run. (Step 530). As discussed above, multiple tests may need to be run on each device 110 to determine if there were any manufacturing defects and/or to calibrate the device 110. In one embodiment, for example, if the device is an accelerometer, three different forces during three separate tests may be applied to the strip 100 to calibrate the devices 110. If there are more tests to run, the tester returns to step 510 to initiate the next test.

When there are no more tests to run, the tester then retrieves data from a first set of the devices connected to the tester which may be used to calibrate the device, or the device may calibrate itself based upon the generated data. (Step 540). The tester, for example, may selectively activate a multiplexor 320 such that the communication I/Os for only one of the two devices coupled to the output of a multiplexor 320 is coupled to the tester 300. In the embodiment illustrated in FIG. 4, for example, the SCL and SDA lines for only one of the devices 110 would be coupled to the tester 300 through a multiplexor 320. However, the connections made by multiplexors 320 for the Vdd and Gnd I/O's would be maintained for both devices, so that the data stored in the memory 210 of both devices 110 is maintained. The tester 300 may then analyze the retrieved data, and if needed, send calibration data to program the devices based upon the analyzed data. In another embodiment, for example, if the device 110 includes a processor, the device 110 can perform a calibration calculation and program itself based upon the calibration calculation. In this embodiment, the data generated by the devices 110 may not need to be retrieved from the devices. The tester then retrieves data from a second set of the devices connected to the tester which may be used to calibrate the device, or the device may calibrate itself based upon the generated data. (Step 550). In one embodiment, for example, the tester 300 will control some of the multiplexors 320 such that the communication I/Os for the other of the two devices coupled to the respective multiplexors 320 is coupled to the tester. The tester 300 can then retrieve the data generated by the devices 110 and send calibration data, if necessary, back to the devices 110. As discussed above, in another embodiment, if the devices 110 include a processor, the devices 110 may calibrate themselves based upon the generated data. Accordingly, by using the multiplexors 320, the number of times each test stimulus has to be applied per strip 100 is reduced by half, reducing the overall test time for the strip 100 significantly. If, for example, three tests are to be run, each test takes ten seconds to perform, and the tester only has to perform each test five times rather than ten times, the amount of test time for the strip 100 is reduced from three-hundred seconds to one-hundred and fifty seconds, significantly reducing the overall test time for each strip.

The tester 300 then indexes to a next subset of untested devices, if there are any, and then returns to step 510 to initiate the first test. (Step 560). In the embodiment illustrated in FIG. 1, for example, the tester 300 may first be coupled to the ninety-six devices 110 in the six columns indicated with the shading. In this embodiment, each multiplexor 320 may be configured to be coupled to two adjacent devices in one of the columns. Further, in this embodiment, for example, the tester 300 may be configured to switch the connections for each multiplexor 320 to an adjacent column (i.e., the column to the right of the current column) each time the tester is indexed in Step 560. However, one of ordinary skill in the art would recognize that there are a variety of ways the tester 300 can connect the multiplexors 320 to the devices 110 so that all of the devices are tested.

Figure 6:
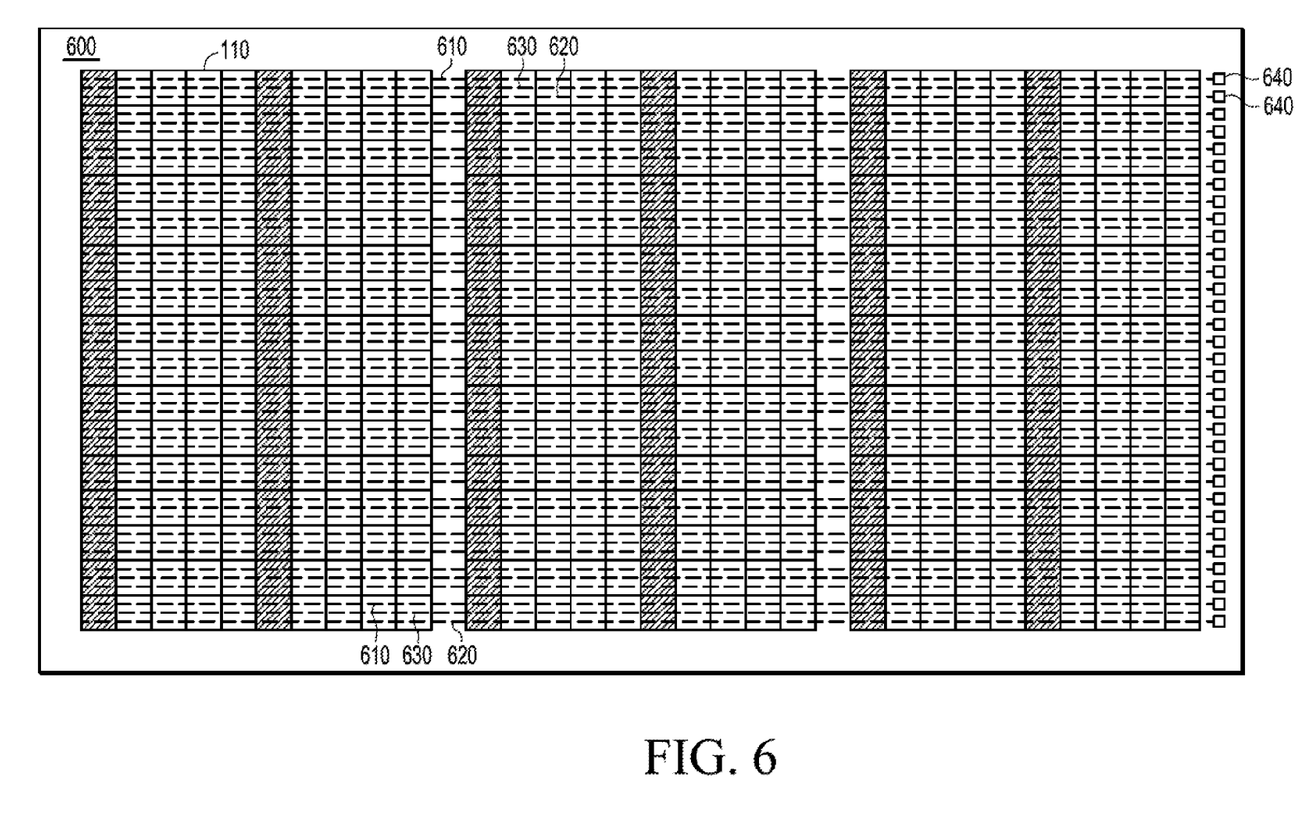
FIG. 6 illustrates a strip of devices in accordance with another embodiment.

FIG. 6 illustrates a strip 600 of devices 110, in accordance with an embodiment. Each device in strip 600 is connected to a voltage hold trace 610 and a ground hold trace 620. In one embodiment, for example, each voltage hold trace 610 and ground hold trace 620 may cross a row of devices 110, as illustrated in FIG. 6. In another embodiment, each voltage hold trace and ground hold trace may cross a column of devices 110. Each voltage and ground hold trace 610 and 620 may be connected to a contact 640. The tester 300 connects each contact 640 to a power source and a ground so that all of the devices 110 can be tested simultaneously, as discussed in further detail below. Furthermore, in one embodiment at least one of the interrupt I/Os for each device in each a row of devices 110 is connected via an interrupt trace 630. In another embodiment, for example, at least one of the interrupt I/Os for each device in each a column of devices 110 is connected via an interrupt trace 630. Accordingly, when the tester 300 sends an interrupt signal to any one of the devices in the connected row or connected columns of devices, each device in the row or column receives the interrupt signal.

Figure 7:
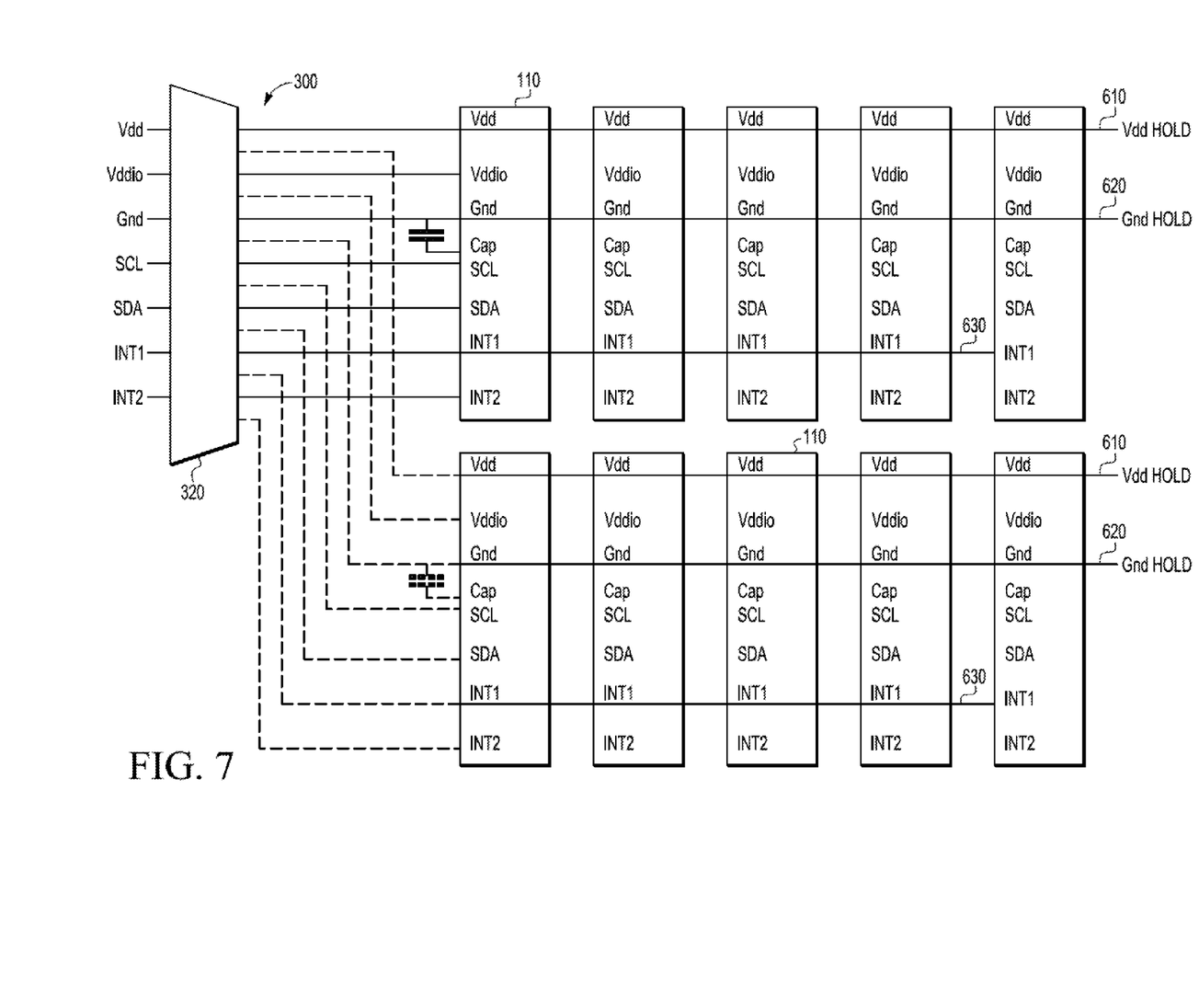
FIG. 7 illustrates how the I/O lines from a tester may connect to the strip of devices illustrated in FIG. 6, in accordance with an embodiment.

FIG. 7 illustrates how the I/O lines from a tester 300 may connect to the strip of devices 110 illustrated in FIG. 6, in accordance with an embodiment. As discussed above, the tester 300 uses multiplexors 320 to connect each communication line of the tester 300 to at least two devices. Each multiplexor 320 is capable of selectively coupling any one of the two devices to a respective I/O line or connecting both devices 110 to the I/O line simultaneously. Each multiplexor 320 may be controlled individually. Accordingly, the multiplexor controlling the power to the devices (e.g., the Vdd I/O line) may be coupled to both devices throughout a test, whereas data communication lines (e.g., the SDA I/O line) may be coupled to just one of the devices at a time. Further, since each device 110 includes a memory 210 and each device receives both power and ground throughout each test, each test stimulus only has to be applied once for each strip of devices.

Figure 8:
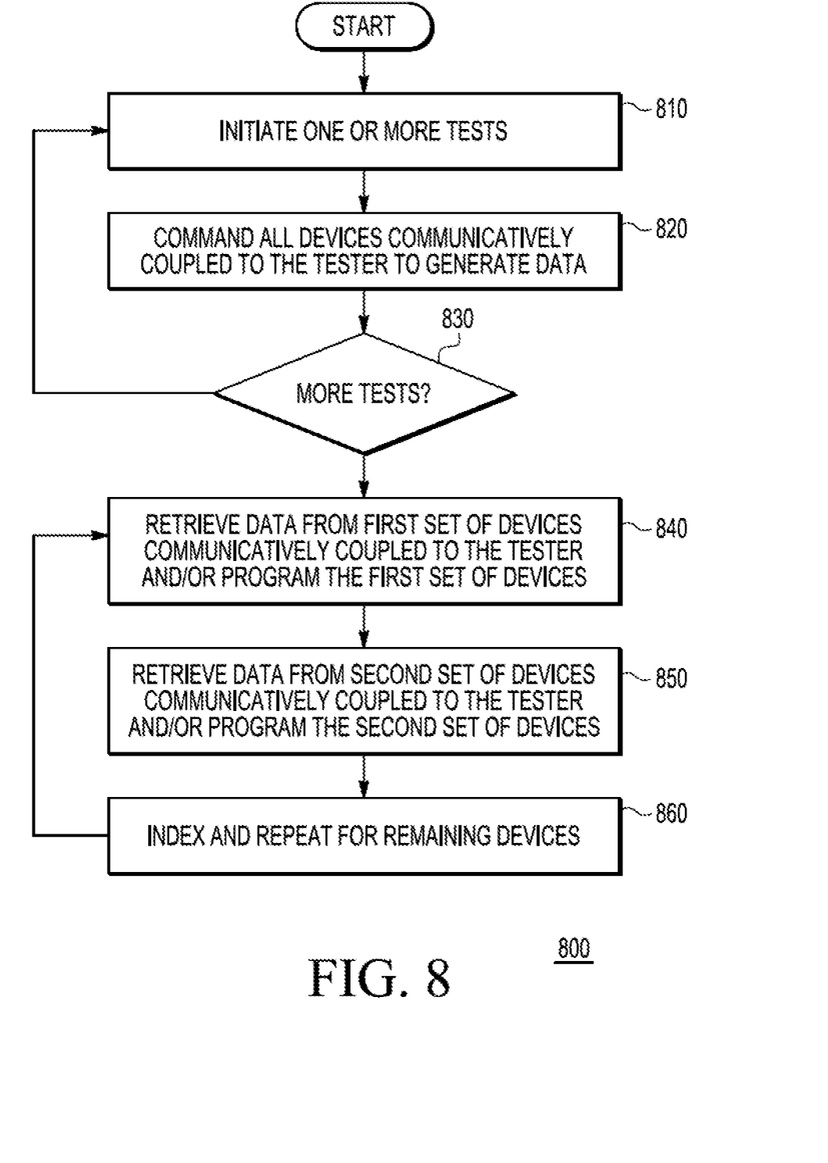
FIG. 8 is a flow chart illustrating another exemplary method for testing devices in accordance with an embodiment.

FIG. 8 is a flow chart illustrating an exemplary method 800 for testing devices in accordance with an embodiment. The method begins when the tester indexes to a first subset of devices and initiates a first test. (Step 810). As discussed above, the test(s) may vary depending upon the device. The tester 300 then commands all of the devices 110 in the strip 600 to generate data. (Step 820). As discussed above, at least one interrupt I/O for each device 110 in every row is connected by an interrupt trace 630. Since each device 110 includes a memory 210, every device 110 can store the generated data for later retrieval. In one embodiment, for example, the memory 210 may be a volatile memory. Accordingly, since each device 110 is connected to power and ground via the respective power and ground traces 610 and 620, each device in the strip 600 can store the data during the test. As discussed above, because the tester 300 employs the multiplexors 320 illustrated in FIG. 7, and each multiplexor 320 is connected to two devices 110, the number of tester I/O resources to test all of the devices in the strip 600 is reduced by half.

The tester then determines if there are any more tests to run. (Step 830). As discussed above, multiple tests may need to be run on each device 110 to determine if there were any manufacturing defects and/or to calibrate the device 110. If there are more tests to run, the tester returns to step 810 to initiate the next test.

If there are no more tests to run, the tester then retrieves data from a first set of the devices connected to the tester which may be used to calibrate the device, or the device may calibrate itself based upon the generated data. (Step 840). In one embodiment, for example, each device may use the tester may selectively activate the multiplexors such that the communication I/Os for only one of the two devices coupled to the multiplexor 320 is coupled to the tester 300. In the embodiment illustrated in FIG. 7, for example, the SCL and SDA lines for only one of the devices 110 would be coupled to the tester 300 through a multiplexor 320. The retrieved data may be analyzed by the tester 300, and, if necessary, the tester 300 may send calibration data to the devices 110 through the communication lines. In another embodiment, for example, if the devices 110 include a processor, the devices 110 may analyze the generated data and program themselves with calibration data based upon the analyzed generated data. The tester 300 then retrieves data from a second set of the devices connected to the tester which may be used to calibrate the device, or the device may calibrate itself based upon the generated data. (Step 850). The tester 300 then indexes to a next set of untested devices, if there are any, and then returns to step 840 to retrieve data from the next column of devices. (Step 860). Because all of the devices 110 are commanded to generate data for each test, each test only has to be run a single time for the entire strip. If, for example, three tests are to be run and each test takes ten seconds to perform, the amount of test time for the strip is reduced from three-hundred seconds to thirty seconds, significantly reducing the overall test time for each strip.

After all of the devices have been tested and/or calibrated, the devices 110 may be separated from each other. In one embodiment, for example, the devices may be sawn apart from the strip. After separation, each device could still include the power trace 610, ground trace 620 and interrupt trace 630 traversing the devices from a first end to a second end, as illustrated in FIG. 6.

In one embodiment, for example, a device is provided. The device may include, but is not limited to, a memory, a test circuit operably coupled to the memory and configure to provide data to be stored in the memory during a test of the device, a signal input coupled to the test circuit, the signal input providing a command to the test circuit, and a signal line trace connected to the trace input, the signal line trace having a first end located generally at one side of the device and having a second end located generally at a second side of the device. The device may further include a ground input, and a ground trace connected to the ground input, the ground line trace having a first end located generally at one side of the device and having a second end located generally at the second side of the device. The device may further include a power input, and a power trace connected to the power input, the power line trace having a first end located generally at one side of the device and having a second end located generally at the second side of the device. In one embodiment, for example, the device may further include a processor coupled to the memory, wherein the processor is configured to calibrate the device based upon the data stored in the memory. In one embodiment, for example the signal input is an interrupt input, wherein the test circuitry is configured to generate test data when the interrupt input receives a signal and to store the generated test data in the memory. In one embodiment, for example the device is a microelectricalmechanical device such as a sensor, such as an accelerometer or a gyroscope, or an actuator.

In another embodiment, for example, a method of testing a plurality of devices is provided. The method may include, but is not limited to, indexing a plurality of communication lines from a tester to a first set of the plurality of devices, wherein each communication line from the tester is selectively coupled to at least two devices of the first set of devices via one of a plurality of multiplexors, initiating at least one test, and commanding all of the devices communicatively coupled to the tester via the plurality of communications lines to generate data for each of the at least one tests. The method may further include retrieving data from a first subset of the first set of devices coupled to the tester via one of the plurality of multiplexors. The method may further include analyzing the retrieved data to generate calibration data for each of the first set of plurality of devices, and programming the first set of plurality of devices with the generated calibration data. The method may further include selectively controlling the plurality of multiplexors to index to a next subset of the set of devices coupled to the tester via one of the plurality of multiplexors, and retrieving data from the next subset of the devices coupled to the tester via one of the plurality of multiplexors. The method may further include indexing the plurality of communication lines from the tester to a second set of the plurality of devices, wherein each communication line from the tester is selectively coupled to at least two devices of the second set of devices via one of a plurality of multiplexors. The method may further include calibrating, by a processor in each device, the devices based upon the generated data.

The plurality of devices may be arranged in a plurality of rows and each multiplexor may be configured to be coupled to devices in at least two rows, wherein the method may further include applying, by the tester, power to each of the plurality of devices via a plurality of power traces coupling a power input for each device in each row of devices, and applying, by the tester, ground to each of the plurality of devices via a plurality of ground traces coupling a ground input for each device in each row of device, wherein a trace couples an interrupt input of each the devices in each row, and the commanding further comprises commanding each of the plurality of devices to generate data for each of the at least one tests. The method may further include storing, in a memory in each device, the data generated for each device.

The term "exemplary" is used herein to represent one example, instance or illustration that may have any number of alternates. Any implementation described herein as "exemplary" should not necessarily be construed as preferred or advantageous over other implementations.

Although several exemplary embodiments have been presented in the foregoing description, it should be appreciated that a vast number of alternate but equivalent variations exist, and the examples presented herein are not intended to limit the scope, applicability, or configuration of the embodiments in any way. To the contrary, various changes may be made in the function and arrangement of the various features described herein without departing from the scope of the claims and their legal equivalents.

What is claimed is:

1. A device, comprising:
    a memory;
    a test circuit operably coupled to the memory and configure to provide data to be stored in the memory during a test of the device;
    a first external input interface to the device, the first external input interface electrically coupled to the test circuit and configured to provide a command to the test circuit upon receipt of a signal, the first external input interface located on a first side of the device;
    a first external output interface from the device located on a second side of the device; and
    a signal line trace electrically connected between the first external input interface and the first external output interface.

2. The device of claim 1, further comprising:
    an external ground input interface to the device;
    an external ground output interface from the device; and
    a ground trace electrically connected between the external ground input interface and the external ground output interface, the ground line trace having a first end located generally at one side of the device and having a second end located generally at the second side of the device.

3. The device of claim 1, further comprising:
    an external power input interface to the device;
    an external power output interface from the device; and
    a power trace connected between the external power input interface and the external power output interface, the power line trace having a first end located generally at one side of the device and having a second end located generally at the second side of the device.

4. The device of claim 1, further comprising:
    a processor coupled to the memory, wherein the processor is configured to calibrate the device based upon the data stored in the memory.

5. The device of claim 1, wherein the first external input interface is an interrupt input interface.

6. The device of claim 5, wherein the test circuitry is configured to generate test data when the interrupt input interface receives the signal and to store the generated test data in the memory.

7. The device of claim 1, wherein the device is a microelectricalmechanical device.

8. The device of claim 7, wherein the device is a sensor.

9. The device of claim 8, wherein the device is an accelerometer.

10. The device of claim 8, wherein the device is a gyroscope.

11. The device of claim 7, wherein the device is an actuator.

12. A method of testing a plurality of devices, comprising:
    indexing a plurality of communication lines from a tester to a first set of the plurality of devices, wherein each communication line from the tester is selectively coupled to at least two devices of the first set of devices via one of a plurality of multiplexors, each of the plurality of devices comprising a first external input interface, the first external input interface electrically coupled to a test circuit and configured to provide a command to the test circuit upon receipt of a signal, the first external input interface located on a first side of each of the plurality of devices, a first external output interface located on a second side of each of the plurality of devices, and a signal line trace electrically connected between the first external input interface and the first external output interface;
    initiating at least one test; and
    simultaneously commanding at least the at least two devices coupled to the tester via the plurality of communications lines to generate data for each of the at least one test.

13. The method of claim 12, further comprising:
    retrieving data from a first subset of the first set of devices coupled to the tester via one of the plurality of multiplexors.

14. The method of claim 13, further comprising:
    analyzing the retrieved data to generate calibration data for each of the first set of plurality of devices; and
    programming the first set of plurality of devices with the generated calibration data.

15. The method of claim 14, further comprising:
    selectively controlling the plurality of multiplexors to index to a next subset of the set of devices coupled to the tester via one of the plurality of multiplexors; and
    retrieving data from the next subset of the devices coupled to the tester via one of the plurality of multiplexors.

16. The method of claim 15, further comprising:
    indexing the plurality of communication lines from the tester to a second set of the plurality of devices, wherein each communication line from the tester is selectively coupled to at least two devices of the second set of devices via one of a plurality of multiplexors.

17. The method of claim 12, further comprising:
    calibrating, by a processor in each device, the devices based upon the generated data.

18. The method of claim 12, wherein the plurality of devices are arranged in a plurality of rows and each multiplexor is configured to be coupled to devices in at least two rows, the method further comprising:
    applying, by the tester, power to each of the plurality of devices via a plurality of power traces coupling a power input for each device in each row of devices; and
    applying, by the tester, ground to each of the plurality of devices via a plurality of ground traces coupling a ground input for each device in each row of devices.

19. The method of claim 18, wherein a trace couples an interrupt input of each the devices in each row, and the commanding further comprises commanding each of the plurality of devices to generate data for each of the at least one tests.

20. The method of claim 12, further comprising storing, in a memory in each device, the data generated for each device.

* * * * *